US 12,062,566 B2

(12) United States Patent
Hurschler et al.

(10) Patent No.: US 12,062,566 B2
(45) Date of Patent: Aug. 13, 2024

(54) DIE EJECTOR

(71) Applicant: Besi Switzerland AG, Steinhausen (CH)

(72) Inventors: Fabian Hurschler, Steinhausen (CH); Stefan Behler, Steinhausen (CH); Brian Pulis, Steinhausen (CH)

(73) Assignee: BESI SWITZERLAND AG, Steinhausen (CH)

( * ) Notice: Subject to any disclaimer, the term of this patent is extended or adjusted under 35 U.S.C. 154(b) by 783 days.

(21) Appl. No.: 17/285,486

(22) PCT Filed: Oct. 15, 2019

(86) PCT No.: PCT/IB2019/058780
§ 371 (c)(1),
(2) Date: Apr. 15, 2021

(87) PCT Pub. No.: WO2020/079589
PCT Pub. Date: Apr. 23, 2020

(65) Prior Publication Data
US 2021/0391205 A1    Dec. 16, 2021

(30) Foreign Application Priority Data

Oct. 15, 2018 (CH) ...................................... 1254/18

(51) Int. Cl.
*H01L 21/683* (2006.01)
(52) U.S. Cl.
CPC *H01L 21/6835* (2013.01); *H01L 2221/68322* (2013.01)
(58) Field of Classification Search
CPC . H01L 2221/68318; H01L 2221/68322; H01L 21/67132; H01L 21/6835;

(Continued)

(56) References Cited

U.S. PATENT DOCUMENTS 6,201,306 B1 * 3/2001 Kurosawa ......... H01L 21/67144
228/8
6,709,543 B2 * 3/2004 Kurosawa ......... H01L 21/67092
438/464

(Continued)

FOREIGN PATENT DOCUMENTS

CH    699851 A1    5/2010
EP    2184765 A1    10/2009

(Continued)

OTHER PUBLICATIONS

KR 20090120208 Translation from Fit database (Year: 2024).*
KR 101791787 Translation from Fit database (Year: 2024).*

*Primary Examiner* — Jeffrey T Carley
*Assistant Examiner* — Joshua D Anderson
(74) *Attorney, Agent, or Firm* — HULTQUIST, PLLC; Steven J. Hultquist

(57) ABSTRACT

A die-ejector (2) comprising a chamber (4) with a cover plate (40) having a passageway, a plurality of plates (56) arranged inside the chamber (4) and reciprocally movable between an initial position (58) and an operating position (60), respectively, intended to interact with the carrier to support the removal of the dies from the carrier, and a drive member (100) for moving the plates (56) to be moved from the operating position towards the initial position. The die-ejector (2) further comprises a magnet (20) and a spring system, respectively, which interacts with anchor sections (74) of the plates (56) and exerts on the plates (54) an attraction force (F') or an impact force, respectively, directed towards the operating position, and a stop member (78) for stopping the movement of the plates (56) in the operating position, the plates abutting the stop member (78) in the operating position.

16 Claims, 4 Drawing Sheets

(58) Field of Classification Search
CPC ............. H01L 21/6836; H01L 21/6838; H01L 21/68742; Y10T 29/53178; Y10T 29/53191; Y10S 156/932; Y10S 156/943; Y10S 156/1179; Y10S 156/1983
See application file for complete search history.

(56) References Cited

U.S. PATENT DOCUMENTS

| | | | |
|---|---|---|---|
| 2003/0075271 A1* | 4/2003 | Yoshimoto | H01L 21/67132 156/716 |
| 2005/0059205 A1* | 3/2005 | Maki | H01L 21/67132 438/232 |
| 2006/0166466 A1* | 7/2006 | Maki | H01L 21/67132 438/464 |
| 2007/0275544 A1* | 11/2007 | Maki | H01L 24/83 438/464 |
| 2007/0277929 A1* | 12/2007 | Trinks | H01L 21/67132 156/707 |
| 2007/0293022 A1* | 12/2007 | Ko | H01L 21/67132 438/464 |
| 2008/0227239 A1* | 9/2008 | Shibata | H01L 21/67132 156/765 |
| 2008/0318346 A1* | 12/2008 | Maki | H01L 22/20 257/E21.53 |
| 2010/0252205 A1* | 10/2010 | Chan | H01L 21/67132 156/707 |
| 2011/0192547 A1* | 8/2011 | Yip | H01L 21/6838 156/758 |
| 2011/0214819 A1* | 9/2011 | Behler | H01L 21/67132 156/707 |
| 2011/0308738 A1* | 12/2011 | Maki | H01L 21/67132 156/756 |
| 2013/0255889 A1 | 10/2013 | Barmettler | |
| 2017/0133259 A1* | 5/2017 | Kwong | H01L 21/6838 |
| 2021/0060798 A1* | 3/2021 | Jeong | H01L 21/67144 |
| 2021/0066112 A1* | 3/2021 | Jeong | H01L 21/6838 |
| 2023/0131572 A1* | 4/2023 | Kawakami | H01L 21/67132 156/707 |

FOREIGN PATENT DOCUMENTS

| | | | |
|---|---|---|---|
| KR | 20090120208 A | 11/2009 | |
| KR | 101791787 B1 * | 10/2017 | H01L 21/67748 |

* cited by examiner

DIE EJECTOR

CROSS REFERENCE TO RELATED APPLICATIONS

This application is the U.S. national stage of International Application No. PCT/IB2019/058780, filed on 2019 Oct. 15. The international application claims the priority of CH 01254/18 filed on 2018 Oct. 15; all applications are incorporated by reference herein in their entirety.

BACKGROUND

The invention relates to a die-ejector according to the generic term of claim 1. Such die-ejectors are used in the assembly of semiconductor dies to support the detachment and removal of a semiconductor die from a carrier.

The semiconductor dies (known as chips in the industry) are typically provided on a carrier held by a frame, preferably a film, also known as tape in the industry, for processing on a semiconductor assembly device. The dies adhere to the carrier. The frame with the carrier is picked up by a sliding wafer table. The wafer table is shifted cyclically to provide one die after the other at a predetermined location. The provided die is then picked up by a die-gripper and placed on a substrate. The removal of the provided die from the carrier is supported by a die-ejector located below the carrier (known in the industry as die-ejector).

A die-ejector known from EP 2 184 765 A1 is a die-ejector comprising a chamber which can be subjected to vacuum having a cover plate with a passageway, a plurality of plates disposed within the chamber, projecting into the passageway and slidable in a direction perpendicular or oblique to the surface of the cover plate, and drive means for displacing the plates. The drive means comprises a drive mechanism comprising a motor and a pin movable along a predetermined rectilinear path. The pin can be moved back and forth by the motor between two positions which determine an initial position or operating position of the plates. In their initial position, the plates are moved back towards the inside of the chamber, and in their operating position, the plates reach their uppermost position in the direction of the passageway. Each plate has a web-shaped opening and the pin passes through the web-shaped opening of each plate. The web-shaped opening may vary from plate to plate such that the plates are moved in a predetermined order to the initial position or operating position when the pin is moved along the path.

With such a die-ejector, the web-shaped opening is gradually mechanically worn out by the movement of the pin, so that the plates no longer exactly reach their originally determined initial positions and operating positions. The service life of the plates is thus reduced, and they must be replaced regularly, which leads to a loss of time and increases maintenance costs.

SUMMARY

A die-ejector (2) comprising a chamber (4) with a cover plate (40) having a passageway, a plurality of plates (56) arranged inside the chamber (4) and reciprocally movable between an initial position (58) and an operating position (60), respectively, intended to interact with the carrier to support the removal of the dies from the carrier, and a drive member (100) for moving the plates (56) to be moved from the operating position towards the initial position. The die-ejector (2) further comprises a magnet (20) and a spring system, respectively, which interacts with anchor sections (74) of the plates (56) and exerts on the plates (54) an attraction force (F') or an impact force, respectively, directed towards the operating position, and a stop member (78) for stopping the movement of the plates (56) in the operating position, the plates abutting the stop member (78) in the operating position.

DETAILED DESCRIPTION

The object of the present invention is therefore to develop the well-known die-ejector in such a way that the plates reliably reach their operating positions. According to the invention, this object is solved by a die-ejector according to claim 1. Preferred embodiments of the invention are reflected in the dependent claims.

The invention relates to a die-ejector comprising a vacuum chamber with a cover plate having a passageway. The surface of the cover plate facing away from the chamber forms a supporting surface for a carrier provided with dies, preferably a plastic film. The chamber has a vacuum connection for connection to a vacuum source.

In a preferred embodiment, the chamber is formed by the housing of the die-ejector.

In a preferred embodiment, the cover plate, on which a part of the carrier rests with the dies during operation, is removable and replaceable. The housing preferably has a cylindrical plate carrier on which the cover plate is replaceably arranged. However, it is possible to form the plate support and the cover plate in one piece together, whereby this component is replaceable.

The cover plate preferably contains a centred passageway, the shape of which is selected according to the characteristics of the dies to be processed. Preferably the passageway is rectangular and has at least approximately the size of the die to be processed.

In a preferred embodiment, the cover plate has a plurality of through-holes designed to aspirate the carrier when the chamber is subjected to a vacuum, so that the carrier is held firmly on the cover plate during die detachment and removal.

Furthermore, the die-ejector comprises a plurality of plates arranged inside the chamber, each of which can be moved back and forth between an initial position and an operating position. The plate plane of the plates is transverse, preferably at least approximately perpendicular to the cover plate, in particular its supporting surface. Preferably the plates are parallel to each other. In the following, the term transverse is not necessarily meant to be perpendicular, but perpendicular is included as a possible direction.

A longitudinal axis of the die-ejector housing is preferably perpendicular to the supporting surface.

The edge portion of the plates facing the cover plate forms an impact edge intended to interact with the carrier to support the removal of the dies from the carrier. The edge area preferably runs at least approximately parallel to the supporting surface. Preferably the impact edge has a single continuous segment. It may also have several separate segments to provide support for die removal in separate areas of the carrier. In a preferred embodiment, the plates have impact edges, as disclosed in document CH 706 280 A1, depending on the characteristics of the dies to be processed.

The term "plates" refers to all objects that can perform the same function. For example, the plates can also be bars or beams.

The initial position is shifted back towards the inside of the chamber with respect to the operating position.

The movement of the plate from the initial position to its operating position is called lifting and from the operating position to its initial position is called lowering and defines the direction of movement of the plate. Preferably, the direction of movement is parallel to the longitudinal axis of the housing and thus perpendicular to the supporting surface.

The operating position of a plate is the position in which the impact edge of the plate is at least approximately flush with the supporting surface or is above the supporting surface and is in its highest position. The initial position of a plate indicates its position in which the operating position of the plate is moved as far back as possible to the inside of the chamber. This means that the impact edge of the plate is in its lowest position in the chamber, below the supporting surface. In their operating position, the plates engage with or penetrate the passageway. The plurality of edges of the plates forms an impact surface, the shape of which can be changed by the movement of the plates. The formation of different shapes for the impact surface and their modification support the removal of the dies in targeted areas of the carrier. Thus, the carrier during the die removal can be flexibly designed according to the characteristics of the dies to be processed and the carrier.

Preferably, the impact edges in the initial position of the plates lie in a preferably at least approximately parallel plane to the supporting surface. Depending on the desired shape of the impact surface, one or more plates can remain in the initial position and are not moved, while the plates that are to be moved are moved. In a preferred embodiment, the impact edges in the operating position of the plates lie in a preferably at least approximately parallel plane to the supporting surface and above this plane. Thus, the impact surface forms a flat area and the impact edges push against the carrier below the die to be removed with a pressure that is uniformly distributed on this area. This reduces the stresses on the die as it is removed from the carrier.

In a preferred embodiment, sensors can be assigned to the initial positions and further sensors to the operating positions to determine the position of the plates. The sensors can be used to check whether a plate is in the desired initial position or operating position and has assumed its correct position in the impact surface. Thus, a faulty position of the plates can be detected and a possible error during the removal of a die can be avoided.

There is a circumferential gap between the impact surface, or the plates in the operating position, and the edge of the passageway. The impact area is preferably slightly smaller than the area of a die. Preferably, the surface area of the die protrudes sideways by about 0.05 to 1 millimetre, particularly preferably 0.3 millimetre, over the impact surface to all side directions. The number of plates depends on the dimensions of the die. For example, three plates can be used for very small semiconductor dies of 3*3 millimetres.

The plates can rest against each other, but preferably they are separated by spacings to minimise friction. In a preferred embodiment, the chamber for guiding the plates comprises two oppositely arranged, comb-like receiving rails, the incisions of which run parallel to the direction of movement on the side of the receiving rails facing the interior of the chamber and each receive an edge region of the plates running parallel to the direction of movement. It is also possible to provide additional support rails to ensure that the plates are guided in a wider edge area, for example if the plates are multi-part or have a large length in the direction of the longitudinal axis of the housing. The incisions are spaced so as to ensure a predetermined distance between the plates when the plates are moved. This avoids friction between the plates and ensures that the plates move parallel to each other in the direction of movement. In such an arrangement, the impact edges have a predetermined distance from each other, preferably a uniform distance, so as to ensure optimum support of the dies when a die is removed.

Furthermore, the die-ejector comprises a drive element drivable by a motor, preferably a stepper motor. The plates each have a drive recess which is penetrated by the drive element. The drive recesses each have a drive area which is designed such that the drive element interacts with the drive area to move the plates to be moved from the operating position to the initial position. According to the invention, the die-ejector comprises a magnet which interacts with anchor sections of the plates and exerts an attractive force directed towards the operating position on the plates. Furthermore, the die-ejector comprises a stop element which stops the movement of the plates in the operating position, the plates resting against the stop element in the operating position.

Thus, neither the drive element alone nor the drive element together with the drive recess determine the operating position, but rather the stop element, which stops the movement of the plates caused by the pulling force of the magnet in the operating position after the movement from the initial position caused by the drive element. Since the stop element makes contact with the plates without friction and only with a stop on a wide contact surface, the stop element is practically not subject to wear. Thus, the plates reliably reach their operating positions over a long period of use exactly where they are held by the magnet.

The magnet is assigned to the operating position and serves to move the plates from the initial position to the operating position via its force of attraction and to hold them in the operating position.

The anchor section is the section of the plates which extends between the magnet and the end of the plates remote from the cover plate. The anchor section is formed by a transverse area extending transversely, preferably perpendicular to the longitudinal axis, which preferably has sections projecting on both sides of the longitudinal axis.

In a preferred embodiment, the drive recess is always arranged in the anchor section. This arrangement makes it easy to make the drive recess because the most space is provided in the anchor section. It also ensures that the point of application of the force of attraction and the point of application of the force exerted by the drive element are close together and cause deformation of the plates or undesirable movement of the plates.

In a preferred embodiment, the magnet is mounted inside the chamber and extends perpendicularly to the direction of movement of the plates so that it extends at least partially over the protruding portions of the transverse region. In order to achieve the required force of attraction on the outermost anchor sections arranged in relation to the central plate, the magnet can extend beyond these.

In a preferred embodiment, the protruding sections extend symmetrically to the longitudinal axis of the housing and the magnet extends symmetrically at least partially over the protruding sections. Thus, a symmetrical distribution of the force of attraction on the plates can be ensured.

The magnet can be multi-part so that the distribution of the force of attraction over the anchor sections is optimised, in particular so that the force of attraction is distributed symmetrically to a plane of longitudinal symmetry of the plates. In a particularly preferred embodiment, the magnet comprises at least two magnetic parts arranged symmetrically to the plane of longitudinal symmetry of the plates which extends perpendicular to the plates. Preferably, the at least two magnetic parts are arranged in a plane transverse to this plane of symmetry. A multi-part design of the magnet also simplifies the replacement of any damaged magnet. Preferably, the magnet or, as the case may be, the magnetic parts comprise magnetic pieces which substantially abut each other in order to achieve the same force of attraction as a one-piece magnet or magnetic part. However, it is possible to provide a gap between adjacent magnet pieces in order to optimise the distribution of the magnetic force of the magnet or, where appropriate, of the magnet parts as required. The gaps can be filled with a non-magnetic material. The magnet or, as the case may be, the magnetic parts may have different shapes, preferably in the form of rods. If necessary, the thickness of the magnet or magnetic parts may vary when viewed in the direction transverse to the direction of movement of the plates. This means that the distribution of attraction can also be optimised as required.

In a preferred embodiment, the position of the magnet in the chamber and the shape of the magnet and anchor sections are dimensioned so that the force of attraction exerted on the anchor sections is at least approximately equal for each of the plates. Thus, the drive element can exert at least approximately the same force against the attraction force of the magnet on the respective drive areas in order to move the plates to be moved from the operating position in the direction of the initial position. This allows a simple control of the movement of the drive element and leads, if at all, to a uniform low wear of the drive element and the drive areas.

Preferably, anchor sections have recesses to optimise the distribution of the magnet's force of attraction on the plates. In a preferred configuration, recesses, preferably rectangular recesses, may be formed on the protruding portions of the transverse region, preferably on the side of the protruding portions facing the magnet, for example every second plate.

In a preferred embodiment, the stop element interacts with the plates in an area of the plates adjacent to the impact edges. This minimizes the distance between the stop element and the impact edges and ensures an exact position of the impact edges in the operating positions of the plates.

In a preferred embodiment, the stop element also stops the movement of the plates in their initial position. For the same reasons as described above for the operating position, mutatis mutandis, the plates reach their initial positions reliably.

In a preferred embodiment, another stop element stops the movement of the plates in their initial position. In contrast to the accuracy in the initial position, a higher accuracy of the position of the impact edges in the operating position is usually required. The properties of the stop element and the further stop element can be determined according to the desired accuracy and different manufacturing processes and materials can be selected if necessary. As a result, costs can be optimized.

In a preferred embodiment, the stop element can be designed in such a way that it also serves to guide the plate. This may also be the case for the further stop element.

Preferably, the stop element and, if necessary, the further stop element are attached to the housing so that they can be replaced. For example, the chamber may have two oppositely arranged openings into which the stop element is pushed, and the stop element may also be fastened to the housing using a fastener. The stop element may be made up of several parts and may, for example, comprise several parts, preferably plate-shaped, lying on top of each other when viewed in the direction of movement of the plates. Thus, the thickness of the stop element and consequently the position of the plates in the operating position can be adjusted by adjusting the number of parts. It is also possible to make the stop element adjustable, for example by means of adjusting screws, in order to adjust the position of the plates in the operating position. This allows easy adaptation of the die-ejector to the characteristics of the dies to be processed. Similar constructions can also be provided for the further stop element.

In a preferred embodiment, the stop element is designed as a preferably flattened bolt which engages through a stop recess of the respective plates. The flattened bolt has at least one first flattened stop side and preferably a second stop side parallel to the first stop side. The stop recess, viewed in the direction of the longitudinal axis, extends over a length which corresponds to the sum of the thickness of the stop element and the stroke of the plate. In the initial position and in the operating position, the first and second stop sides lie against the respective stop recesses over a wide contact surface in order to stop the plates more reliably. Thus, the accuracy for reaching the operating position as well as for reaching the initial position can be increased.

Preferably the stop recesses each have a first and a second flat edge portion formed parallel to the first and second stop sides, respectively, which interact with the first and second stop sides to stop the plates more accurately. Thus, the accuracy for reaching the operating position as well as for reaching the initial position can be further increased over a long operating time.

In a preferred embodiment, there is always a gap between the magnet and the plates. This prevents the plates from hitting the magnet when the operating position is reached. Preferably, the gap is an air gap. This protects the magnet from mechanical destruction and reduces the risk of the magnet breaking. It is also possible not to provide a gap between the magnet and the plates. In this case, the magnet fulfils the function of the stop element. If necessary, the magnet can be protected by a protective layer to protect it from mechanical destruction.

Preferably, the plates have a longitudinal area and at least one cross beam. The at least one cross beam forms the anchor section while the free end of the longitudinal area facing the cover plate forms the impact edge. For example, the plates can be cross-shaped or have two spaced cross beams, preferably parallel to each other.

In a preferred embodiment, the plates are T-shaped. The cross beam forms the anchor section while the free end of the longitudinal area forms the impact edge. The side of the transverse beam facing the magnet is at least approximately parallel to the surface of the magnet facing the anchor section. Thus, the plates are arranged in the position of an upside down T in the chamber. A T-shape advantageously combines a wide cross beam serving as an anchor section for efficient interaction with the magnet and a narrow longitudinally extending longitudinal portion which allows a compact and space-saving design of the package in its cover plate facing portion so that there is space for other modules in the vicinity of the die-ejector.

In a preferred embodiment, the plates are formed in several parts, preferably in two parts, with a base plate with which the magnet interacts, which contains the drive recess and has the anchor section, and a support plate having the impact edge, which can be placed on the base plate via a mechanical connection. The support plates are selected according to the specific application of the die-ejector and are mounted on the base plates in the usual way, without exchanging the base plates. This allows easy adaptation of the die-ejector to the characteristics of the dies to be processed, for example the size of the dies. The number of support plates may be less than the number of base plates. The support plates can be of the same design.

It should be understood below that the support plates and base plates are in the operating position or initial position when the plates are in the operating position or initial position.

In a preferred embodiment, the base plates are T-shaped and have the cross beam and a portion of the longitudinal area, while the remaining portion of the longitudinal area forms the support plates. The base plates can be of the same design.

In a preferred embodiment, the base plates each have the anchor section. Preferably the cross beam forms the anchor section.

In a preferred embodiment, the base plates are guided by mounting rails and the support plates by further, identically designed mounting rails.

In a preferred embodiment, the support plates each have the stop recesses which are penetrated by the stop element. Preferably, the stop recesses are formed in an area of the plates adjacent to the impact edges, so that the distance between the stop element and the impact edges is minimised. Thus, an exact position of the impact edges in the operating position of the plates can be achieved.

In a preferred embodiment, the stop element stops the movement of the support plates in their operating position and in their initial position. The support plates thus stop the corresponding base plates at the same time. However, it is preferable to form additional stop recesses in the base plates, which are penetrated by the additional stop element, so that the base plates can also be stopped if the support plates are not placed on certain base plates. In a preferred embodiment, the further stop element stops the movement of the base plates in their initial position and the stop element stops the movement of the support plates in their operating position.

In a preferred embodiment, the die-ejector comprises a further magnet which is assigned to the initial position.

In addition, the drive recesses each have a further drive area. The further drive area is designed in such a way that the drive element interacts with the further drive area to move the plates to be moved from the initial position in the direction of the operating position.

In a preferred embodiment, the drive recesses of all plates are of the same design.

If necessary, there is always a further gap between the other magnet and the plates in order to prevent the plates from striking against the other magnet when the initial position is reached. The further gap can also be an air gap. Thus, the further magnet is also protected against mechanical destruction and the danger of a breakage of the further magnet is reduced.

The anchor section of the plates is located between the magnet and the other magnet.

In the preferred embodiment with T-shaped plates which have a transverse beam, the side of the transverse beam facing the further magnet can run at least approximately parallel to the surface of the further magnet facing the anchor section.

The further magnet can also be multi-part, in order to optimally distribute the force of attraction over the anchor sections. In addition, a multi-part design simplifies the replacement of any damaged magnets. In a particularly preferred embodiment, the further magnet comprises at least two further magnet parts, which are arranged symmetrically to the longitudinal symmetry plane of the plates. Preferably, the at least two further magnet parts are arranged in a plane transverse to this symmetry plane. The further magnet is located at the bottom of the chamber in a particularly preferred embodiment.

Preferably, the further magnet or magnet parts comprise further magnet pieces in a similar manner to the magnet or magnet parts.

In a preferred embodiment, the magnet and the further magnet are arranged in such a way that they are polarized in opposite polarization directions. Preferably, the polarization directions are at least approximately parallel to the direction of movement. Thus, the magnetic fields of the magnet and of the further magnet each exert an attraction force directed substantially parallel to the direction of movement on the plates which are made of a magnetizable material, e.g. metals such as iron. The attraction force of the magnet and that of the further magnet is directed in the direction of the operating position or the initial position. Preferably the magnet and the further magnet are permanently magnetised.

In a preferred embodiment with the magnet and the further magnet, the drive element moves the anchor section of the plates to be moved from the initial position towards the operating position away from the further magnet towards the magnet, at least until the attraction force of the magnet is greater than that of the further magnet. The plates to be moved then move to the operating position under the attraction of the magnet. Conversely, the drive element moves the anchor section of the respective plates to be moved from the operating position in the direction of the initial position away from the magnet in the direction of the further magnet, at least until the attraction force of the further magnet is greater than that of the magnet. The plates to be moved then move to the initial position under the force of attraction of the magnet.

It is also conceivable to arrange the magnet and the other magnets in such a way that they are polarized in the same polarization direction. This arrangement can be used if the distance between the magnet and the further magnet is such that the force of attraction of the magnet and the further magnet does not overlap significantly.

Preferably, anchor sections have recesses, preferably rectangular recesses, at their edge portion facing the further magnet in order to optimise the attraction of the further magnet to the plates.

In a preferred embodiment, the drive element comprises a camshaft rotatably driven by the engine, the cams of which are intended to interact with the drive area and the further drive area of the plates to be moved. Preferably, a cam interacts together with the drive area and the further drive area of a single plate. However, it is also possible for cams to interact with the drive area and the further drive area of two or more plates. The use of a camshaft with cams allows quick and easy adjustment of the movement of the plates. Camshafts with different profiles can be manufactured in advance and installed depending on the specific application of the die-ejector. This embodiment allows the plates to be moved by driving the shaft in a single direction of rotation, making it particularly easy to control the shaft.

Such camshafts can, for example, be made of steel by additive manufacturing. In a particularly preferred embodiment, the cams are offset in the circumferential direction of the camshaft in such a way that the plates are moved in a predetermined sequence between the initial position and the operating position and vice versa.

The cams protrude radially outwards with respect to a circular cylindrical shaft part of the camshaft and, viewed in the longitudinal direction of the camshaft, may be arranged one behind the other, preferably offset in the circumferential direction.

The cams are preferably tooth-shaped and, viewed in the direction of rotation, each have a leading impact side and a rear side. The arrangement of the cam sides relative to each other determines the sequence of the interaction of the cam sides with the drive area and the further drive area of the plates and thus the movements of the plates from the initial position into the operating position or from the operating position into the initial position.

The distance measured in the circumferential direction between the impact sides of two successive cams together with the rotational speed of the camshaft determines the time delay between the movements of the plates concerned. In a particularly preferred embodiment, the cams are symmetrically arranged at right angles to the axis of rotation of the camshaft with respect to a mirror plane running through a centrally arranged cam. This arrangement of the cams allows the plates to be moved from the initial position to the operating position or from the operating position to the initial position symmetrically to the plate assigned to the centrally arranged cam.

Preferably, the cams are arranged in a V-shape as seen in the unwinding of the camshaft, with the central cam forming the tip of the V-shape and the remaining cams being offset forward as seen in the direction of rotation. Thus, first the outermost plates can be moved symmetrically to the plate assigned to the centrally arranged cam during the movement from the operating position towards the initial position, and finally the plate assigned to the centrally arranged cam can be moved. This arrangement allows a gradual release of the film from the die from the sides of the die towards the centre of the die.

In a preferred embodiment, the cams have an involute shape. The involute shape of the cams contributes to minimizing mutual sliding of the cams and the drive areas and the associated wear and heat development. Preferably the impact sides of the cams have an involute shape. However, it is also possible to provide an involute shape for the rear of the cams if the camshaft has to be driven in both directions of rotation.

In a preferred embodiment, the drive region is formed by a shoulder formed on the plate in question and the further drive region is formed by a further shoulder formed on the plate in question, which preferably extend transversely to the direction of movement of the plate. The formation of the shoulder and the other shoulder transverse to the direction of movement of the plate means that they can be aligned at any angle according to the geometric requirements of the drive element. By forming the shoulder and the other shoulder essentially at right angles to the direction of movement, it is ensured that the force exerted by the cam on the shoulder or the further shoulder acts as far as possible in the direction of movement, so that transverse forces are almost completely avoided. The alignment of the shoulder and the further shoulder is therefore chosen so as to minimise friction between the cam and the plate in question. The cam in question, i.e. the cam assigned to the plate in question, pushes the shoulder when turning the camshaft and the further shoulder when turning it further.

In a preferred embodiment, the drive element is designed as a shaft rotatably driven by the motor about its axis, the outer circumference of which forms control cams in planes perpendicular to the axis. Each control cam encloses a flat disc-shaped portion of the shaft having a non-uniform edge, the thickness of which is such that the control cam comes into contact with a single plate or with several plates. The shaft area with the control cams is preferably designed in one piece.

However, it is also possible to connect a large number of separate discs with a non-uniform edge, which form the shaft area with the control cams. In this embodiment, the die-ejector comprises the magnet, and the further magnets, i.e. the magnets assigned to the initial position, can be dispensed with. Each control cam interacts with the drive area of a plate at a contact point. Preferably, a control cam is assigned to each plate. However, it is possible to form a control cam so that it interacts with the drive area of two or more plates simultaneously.

Preferably, the drive area is formed in the area of the drive recess facing the bottom of the chamber. In a preferred embodiment, the drive area is formed by a shoulder formed on the plate in question, which preferably runs transversely, particularly preferably substantially at right angles, to the direction of movement of the plate. The shoulder is essentially formed at right angles to the direction of movement to ensure that friction between the control cam and the drive area is minimised.

When the shaft is turned, the control cams are rotated at the same time. In this way, the movement of the control cams resulting from the rotation of the shaft is mechanically transferred to the plates via the drive area.

To transfer the plates from the operating position to the initial position, the shaft is turned from an operating rotary position, in which the plates are in the operating position, to an initial rotary position, in which the plates are in the initial position. The magnet assigned to the operating position serves to move the plates from the initial position in the direction of the operating position via its force of attraction and to hold them in the operating position. As the shaft rotates, a control cam interacts with the drive area of an associated plate or plates to push the plate or plates against the magnet's force of attraction towards the initial position as a result of the increase in the radius of the control cam. The movement of the plates from the initial position to the operating position is also controlled via the control cams.

The distance, measured between the axis of the shaft and the contact point of the drive area, is called the effective radius of the control cam. The effective radius for the respective control cams in the operating rotary position is smaller than in the initial rotary position.

A portion of the control cam in which the control cam is in contact with the drive area of the plate when the shaft is turned is called the effective section of the control cam. The radius of the control cam, measured between the shaft axis and the outer circumference of the control cam, and the effective radius are therefore equal in the effective portion of the control cam.

A portion of the control cam that has no contact with the drive area of the control cam is called a passive portion of the control cam. This is the case for a portion whose radius is smaller than the effective radius, so that when the shaft is turned, the control cam has no contact with the drive area of the plate in question. This is also the case for a section of the control cam that does not come into contact with the drive area because the shaft is not rotated to that section.

When turning the shaft from the operating rotary position to the initial rotary position, the effective portion of the control cam interacts with the drive area of the plate. The control cams are designed in such a way that the radius of the respective control cams increases when the shaft is turned from the operating rotary position to the initial rotary position. As the shaft continues to rotate, the control cam pushes the associated plate(s) further and further in the direction of the initial position, while the magnet simultaneously exerts an attractive force in the direction of the operating position. As a result, the plates are lowered from the operating position and remain in contact with the control cam.

The radius increases continuously between the operating position and the initial position, preferably to allow continuous movement of the plates as the shaft rotates.

To transfer the plates from the initial position to the operating position, the shaft is turned from the initial rotary position to the operating rotary position. As the shaft rotates, a control cam interacts with the drive area of an associated plate or plates, and the plate or plates is or are pulled towards the operating position by the pull of the magnet as a result of the decrease in the radius of the control cam. When the operating position is reached, the plates rest against the stop element and are held in the operating position by the magnet.

In a preferred embodiment, there is a gap between the drive area of the plate and the control cam in the operating position. This means that the effective radius is greater than the radius of the control cam, so that the plates to be moved have no contact point with the shaft in the operating position. This ensures that the plates are stopped in the operating position by the stop element and are no longer in contact with the control cams. The plates therefore reach the operating position reliably because they can rest against the stop element. In this embodiment, the passive portion of the control cam lies in the operating position opposite the drive area of the plates. When turning the shaft from the operating rotary position to the initial rotary position, no control cam has a contact point with the relevant drive area right at the start.

Since the radius of the respective control cams increases as the shaft rotates from the operating position to the initial position, control cams come into contact with the plates to be moved at their drive area as the shaft continues to rotate. When the contact point is reached, the drive area begins to interact with the effective portion of the control cam. Depending on the desired beginning of the movement of a plate from the operating position to the initial position, the beginning of the effective portion of the control cam is formed. The radius of the respective control cams continues to increase, so that the plates are pushed from the operating position against the force of attraction of the magnet towards the initial position as a result of the increase in the radius of the control cam. The effective portion of each control cam extends from a first radius associated with the operating position to a larger second radius associated with the initial position. Preferably, the radius at the effective portion increases continuously and the control cam forms an essentially spiral bow.

In the operating rotary position, the plates are in the operating position and the first radius of each cam is smaller than the effective radius of each cam. This corresponds to a rotary position of the shaft in which the passive portion of the control cam is opposite the drive area, i.e. no plate is in contact with a control cam. The plates are in contact with the stop element and there is a gap between the control cam and the drive area.

At the initial rotary position, plates are at initial position and the second radius is the same size as the effective radius of the control cam. This corresponds to a rotary position of the shaft in which the drive area has reached the end of the effective portion of the control cam.

In the passive portion, the radius can decrease continuously or gradually from the second radius to the first radius. For example, the passive portion may be partially straight.

The rotation of the shaft can be controlled by the motor control depending on the desired movement of the plates. The rotation of the shaft can thus be designed continuously or stepwise in one direction of rotation. In a preferred embodiment, the shaft is driven back and forth between the initial rotary position and the operating rotary position.

In a preferred embodiment, the control cams in the circumferential direction of the shaft are formed such that the plates are moved in a predetermined order between the initial position and the operating position and vice versa. In a particularly preferred embodiment, the control cams are symmetrical with respect to a mirror plane running through a centrally arranged control cam, perpendicular to the axis of rotation of the shaft. This embodiment of the control cams allows the plates to be moved from the initial position to the operating position or from the operating position to the initial position symmetrically to the plate assigned to the centrally arranged control cam.

Preferably the effective sections of the control cams, seen in the unwinding of the shaft, have a V-shaped arrangement, whereby the central effective section forms the tip of the V-shape and the remaining effective sections, seen in the direction from the operating position of rotation to the initial position of rotation, are offset forward with respect to the tip of the V-shape. Thus, first the outermost plates can be moved symmetrically to the plate assigned to the centrally arranged control cam during movement from the operating position towards the initial position, and finally the panel assigned to the centrally arranged control cam can be moved. This arrangement allows a gradual release of the foil from the die from the sides of the die towards the centre of the die.

In a preferred embodiment, one end face of the shaft has a recess centric to the axis, arcuate and grooved to accommodate a pin fixed relative to the chamber. One end of the recess forms a first rotary stop of the shaft assigned to the operating rotary position and the other end forms a second rotary stop of the shaft assigned to the starting rotary position. Thus, the rotation of the shaft can be reliably stopped in the operating rotary position and in the initial rotary position. The first and the second fence are designed in such a way that the pin is in contact with the first and the second fence, respectively, only when all plates have reached their operating position and their initial position, respectively.

In a preferred execution form, the control cams are arranged such that the plates are moved in a predetermined order between the initial position and the operating position and vice versa.

In a preferred configuration, the die-ejector comprises a spring system which interacts with anchor sections of the plates and exerts an impact force on the plates in the direction of the operating position. It is possible to do without the magnet and the other magnets. A die-ejector without any magnets is an advantageous arrangement if a possible interaction of the magnetic fields with other components inside or outside the die-ejector must be avoided.

In addition, the drive element is designed as a shaft driven by the motor and rotatable about its axis. The shaft can be the same as in the previous embodiment, the outer circumference of which forms control cams in planes perpendicular to the axis. The control cams have the same characteristics and operate with the drive areas of the plates as explained above.

The spring system can be arranged at the bottom of the chamber and serves to move the plates from the initial position to the operating position via its impact force and to hold them in the operating position.

The spring system can be designed as a plurality of spring strips arranged at the bottom of the chamber, whereby one spring strip is assigned to each plate and interacts with one plate.

The spring system can preferably comprise comb-like bending spring tongues protruding from a mounting plate, which each interact with a plate. Other spring systems are also suitable, as long as an impact force in the direction of the operating position can be exerted on the respective plates. The impact force causes the drive area of the plates that are to be moved to remain in contact with the outer circumference of the shaft when the shaft is turned, namely at at least one contact point with the control cam assigned to the plates to be moved, as long as the plates to be moved have not reached the stop element. The shaft lifts off from the drive area of the plates to be moved as soon as they reach the stop element. Plates that remain in the initial position are held in the initial position by the shaft via the relevant control cam.

According to the invention, the impact force includes not only positive but also negative values, so that a negative impact force equals a positive attraction force.

According to the invention, the spring system comprises a compression spring or an attraction spring or a combination thereof to exert the force of attraction directed towards the operating position, preferably on the plates.

BRIEF DESCRIPTION OF THE DRAWINGS

Further advantages and features of the invention can be seen in the following description of an exemplary embodiment, which is explained using the enclosed figures, in which.

DETAILED DESCRIPTION OF THE PREFERRED EMBODIMENTS

Figure 1:
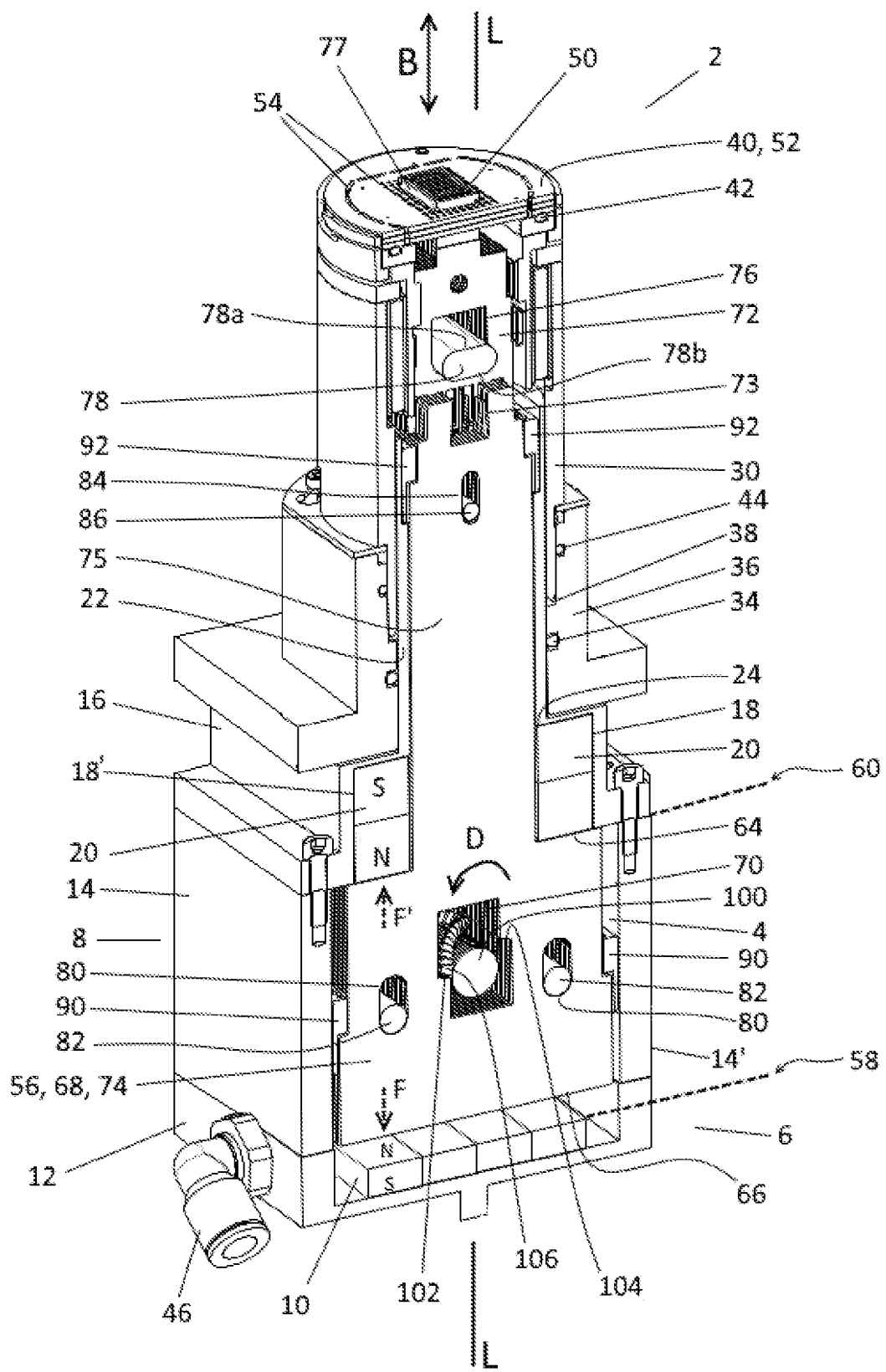
FIG. 1 shows a cross-section in the longitudinal direction of a first embodiment of the die-ejector according to the invention, represented in perspective view.

In a first embodiment, the die-ejector 2 as shown in FIG. 1 comprises a chamber 4 which can be subjected to vacuum and which is formed by a multi-part housing 6 defining a longitudinal axis L. The chamber 6 is formed by a multi-part housing 6 defining a longitudinal axis L. The housing 6 comprises a parallelepipedal housing part 8, which comprises a housing cover 16, an airtight base 12 extending perpendicular to the longitudinal axis L, two side walls 14 or 14', an end wall (not shown) and a rear wall (not shown). The housing cover 16 is attached in an airtight manner to the housing part 8 and has a circular opening 24 from which a tube part 22 extending along the longitudinal axis L protrudes.

Furthermore, the housing 6 comprises a flange 36 having a circular cylindrical passageway, which is pushed onto the tube part 22. In a first end area of the flange facing the housing cover 16, the passageway has a diameter which is slightly larger than the outer diameter of the tube part 22. In the first end area of the flange, the flange 36 lies in an airtight manner against the tube part 22 via an O-ring 34 arranged in the flange 36. In a second end area of the flange remote from the housing cover 16, the passageway has a larger diameter than the outer diameter of the tube portion 22 to form a circumferential recess 38 intended to receive a circular cylindrical plate support 30.

The housing 6 also comprises the circular cylindrical plate carrier 30, on which a cover plate 40 is airtight and replaceable via a further O-ring 42. The plate carrier 30 is pushed onto the tube part 22, pushed into the circumferential recess 38 and in the assembled state lies airtight against the tube part 22 via a further O-ring 44 arranged in the flange 36.

The chamber 4 has a vacuum port 46 for connection to a vacuum source. The cover plate 40 has a passageway 50 and the surface of the cover plate 40 facing away from the chamber 4 forms a support surface 52 for a carrier provided with dies, which carrier is not shown in FIG. 1. The support surface 52 is perpendicular to the longitudinal axis L of the housing 6 of the die-ejector 2. In addition, the cover plate 40 has a plurality of through holes 54 arranged around the passageway 50 which serve to suck in the carrier when vacuum is applied to chamber 4, so that the carrier is held firmly on the cover plate 40 during the die detachment and removal.

The die-ejector 2 further comprises a plurality of plates 56 arranged inside the chamber 4, parallel to each other and parallel to the longitudinal axis L of the housing 6, which are movable back and forth in a direction of movement B in the direction of the longitudinal axis L, respectively between an initial position 58 and an operating position 60. The plate plane of the plates 56 is perpendicular to the cover plate 40 and to the side walls 14 and 14' respectively. Due to the design, the plate plane is therefore parallel to the longitudinal axis L.

The housing cover 16 has on its side facing the inside of the housing part 8 two installation recesses 18 and 18', respectively, which run parallel to the side walls and are arranged symmetrically with respect to a longitudinal plane of symmetry of the plates 4 encompassing the longitudinal axis L. A multi-part magnet 20 is arranged in each installation recess. A further multi-part magnet 10 is arranged on the bottom.

The magnet 20 is assigned to the operating position 60 and the magnet 10 is assigned to the initial position 58. The magnet 20 and the further magnet 10 extend perpendicular to the plate plane and are permanently polarized in opposite polarization directions, marked by S-N and N-S, respectively, which are at least parallel to the direction of movement B. Thus, the magnetic field of the magnet and of the further magnet 20 and 10, respectively, exert an attraction force F and F', respectively, on the plates 56, said force being substantially parallel to the direction of movement B.

The plates 56 are formed in two parts and each comprise a base plate 68, which contains a drive recess 70, and a support plate 72, which is placed on the base plate 68 and is connected to the base plate 68 by a mechanical connection 73. The drive recesses of all base plates 68 are of the same design.

The base plates 68 are T-shaped and each have a longitudinal area 75, to which the support plates 72 are attached, and a crossbeam 74. The crossbeam 74 forms an anchor section 74. The side 66 of the crossbeam 74 facing the further magnet 10 runs parallel to the surface of the further magnet 10 facing the crossbeam 74 and the side 64 of the crossbeam 74 facing the magnet 20 runs parallel to the surface of the magnet 20 facing the crossbeam 74.

The edge portion of the support plates 72 facing the cover plate 40 forms an impact edge 77, which is intended to interact with the carrier in order to support the removal of the dies from the carrier. The support plates 72 each have a stop recess 76, which is penetrated by a stop element 78. The stop recesses 76 of all support plates 72 are of the same design.

The stop element 78 is designed as a flattened bolt which penetrates the stop recess 76 of the respective plates 56. The flattened bolt has a first flattened stop side 78a and a second stop side 78b parallel to the first stop side. The stop recess 76, viewed in the direction of the longitudinal axis L, extends over a length corresponding to the sum of the thickness of the stop element 78 and the stroke of the plate 56.

In addition, the base plates 74 each comprise two further stop recesses 80 formed in their anchor section, which are penetrated by a further stop element 82 formed as a bolt. The base plates 68 also each comprise a slot-like recess 84 in their longitudinal area 75, which is penetrated by a pin-shaped guide element 86. The recess 84 serves to guide the movement of the longitudinal area 75, so that the direction of movement B of the plates 56 remains parallel to the longitudinal axis L. The recesses 84 of all base plates 68 have the same design.

To guide the base plates 68, two comb-like mounting rails 90 are arranged opposite each other on the side walls 14 or 14', the incisions of which run parallel to the direction of movement B on the side of the mounting rails 90 facing the interior of the chamber. The incisions each take up an edge area of the base plates 68 running parallel to the direction of movement and are spaced from each other in such a way that a predetermined distance between the base plates 68 is ensured when the plates 56 are moved.

For guiding the base plates 68, the tube part 22 also includes two further mounting rails 92, which are designed in the same way as the mounting rails 90 and are arranged on the opposite side.

The drive recesses 70 are penetrated by a drive element 100 and each have a drive area 102 and a further drive area 104. The drive element 100 is designed as a camshaft 100, whose tooth-like cam 106 interacts with the drive area 102 and the further drive area 104 of the plates 56 to be moved.

The drive area 102 and the further drive area 104 are each formed by a shoulder 102 or further shoulder 104 formed on the plate 56 and running transversely to the direction of movement B of the plate 56.

Figure 2:
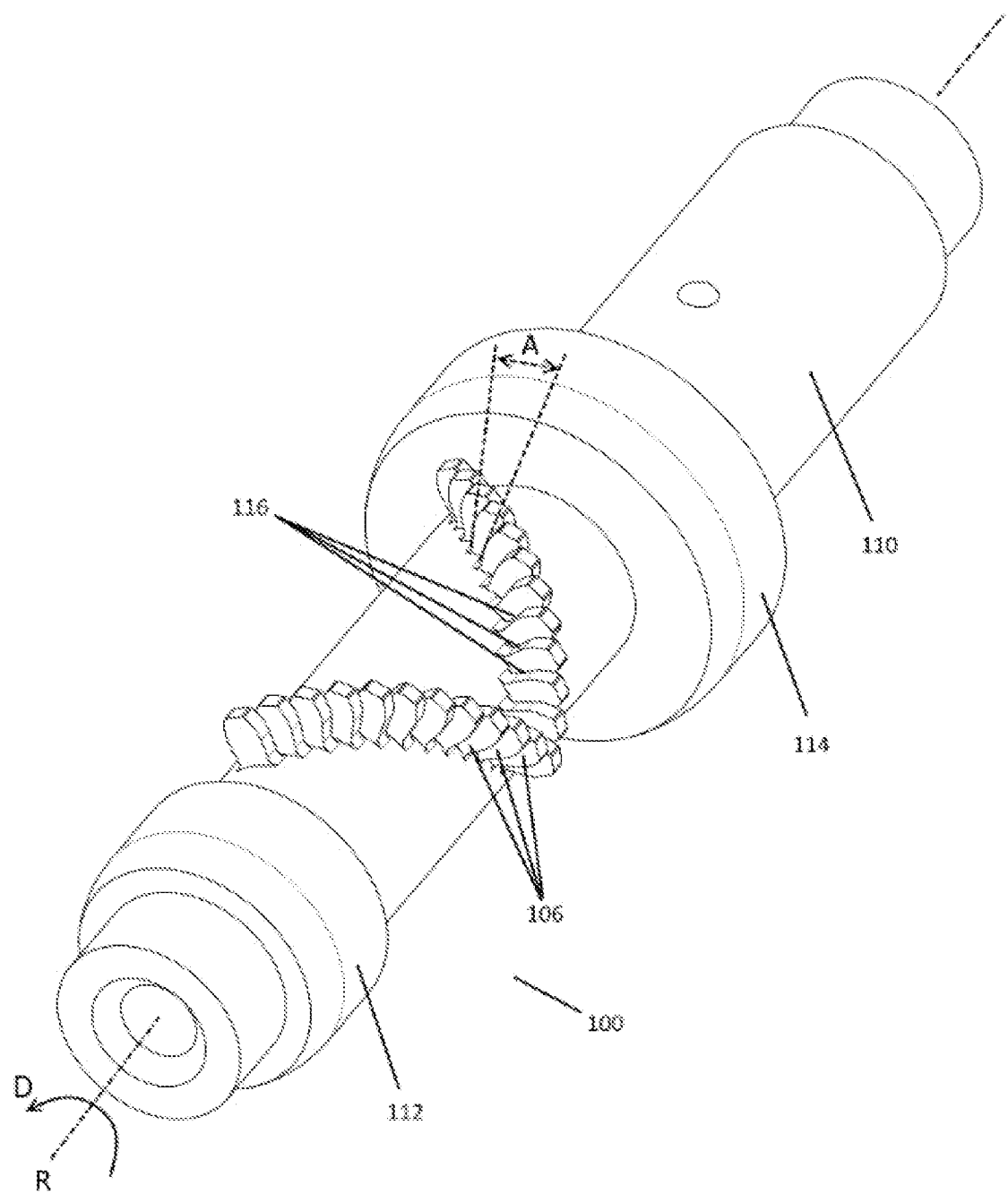
FIG. 2 shows a perspective view of the camshaft installed in the die-ejector as shown in FIG. 1.

The camshaft 100 is driven by an engine in one direction of rotation D. The camshaft 100 shown in FIG. 2 comprises a circular cylindrical shaft part 110 with a first and a second shaft hub 112 and 114, respectively. In the assembled state, the first shaft hub 112 is arranged rotatably sliding in the end wall and the second shaft hub 114 is arranged rotatably sliding in the rear wall of the housing 6.

Between the first and second shaft hubs 112 and 114, respectively, the cams 106 protrude radially outward with respect to the shaft part 110. The cams 106 are symmetrically arranged with respect to a mirror plane running through a centrally arranged cam, said cams being perpendicular to a rotation axis H of the camshaft 100. The cams 106, seen in the unwinding of the camshaft 100, have a V-shaped arrangement, with the central cam forming the tip of the V-shape and the cams 106, seen in the direction of rotation, being offset forward.

The cams 106 each have, seen in direction of rotation D, a leading impact side 116, the shape of which is an involute shape. The impact sides 116 of two successive cams 106 show a distance A measured in the circumferential direction.

The arrangement of the plates 56 shown in FIG. 1 corresponds to a momentary embodiment of the die-ejector 2, whereby all plates 56 are in the operating position 60 and rest against the stop element 78. The impact edges 77 protrude over the supporting surface 52. When the camshaft 100 is rotated in the direction of rotation D, the impact sides 116 interact with the respective shoulder 102 to move the plates 56 to be moved from the operating position 60 in the direction of the initial position 58.

The arrangement of the impact sides 116 of the cams 106 relatively to each other determines the order of interaction of the impact sides 116 with the shoulders 102. Since the drive recesses of all base plates 68 are of the same design and the cams 106 have a V-shaped arrangement as seen in the development of the camshaft 100, the two outermost plates 56 that are symmetrical to the plate 56 assigned to the centrally arranged cam are first moved from the operating position 60 in the direction of the initial position 58. The interaction of the impact sides 116 with the shoulder 102 takes place at least until the attraction force F of the further magnet 10 is greater than the attraction force F' of the magnet 20. The plates 56 then move under the force of attraction F of the further magnet 10 in the direction of the initial position 58.

As the camshaft 100 continues to rotate, the next impact sides 116, seen in the circumferential direction of the camshaft 100, of the two next outer plates 56, interact with the shoulder 102 of the two next outer plates 56 that are symmetrically to the plate 56 assigned to the centrally arranged cam, and move said next outer plates from the operating position 60 in the direction of the initial position 58.

Finally, the plate 56 assigned to the centrally arranged cam is moved from the operating position 60 in the direction of initial position 58.

As the camshaft 100 continues to rotate in the direction of rotation D, the impact sides 116 interact with the further shoulder 104 to move the plates 56 to be moved from the initial position 58 to the operating position 60. As already explained, mutatis mutandis, first the two outermost plates 56 are moved symmetrically to the plate 56 assigned to the centrally arranged cam 56 from the initial position 58 in the direction of the operating position 60.

Figure 3:
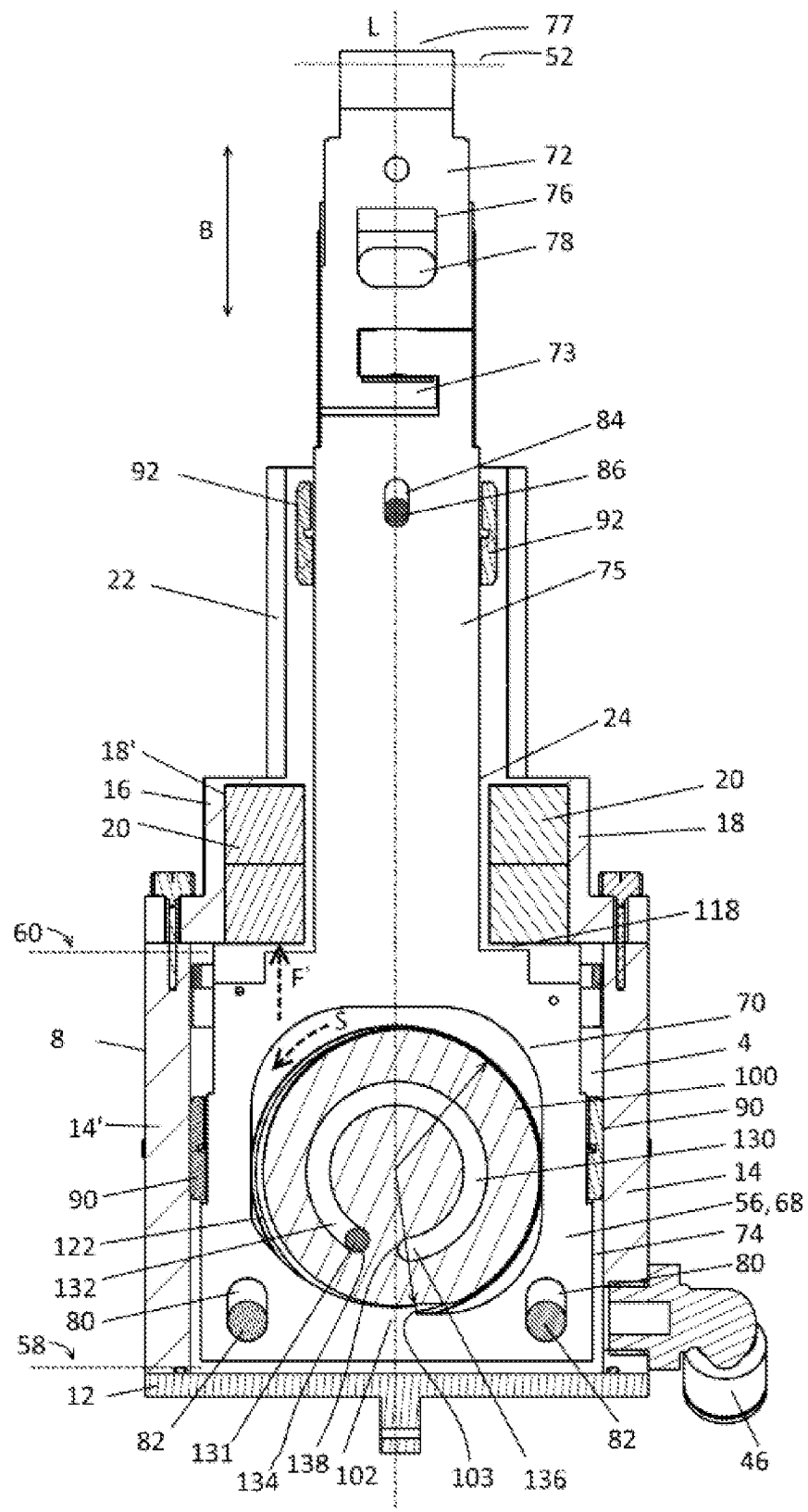
FIG. 3 shows a cross-section in the longitudinal direction of a part of an second embodiment of the die-ejector according to the invention.

In a second embodiment of the die-ejector 2 according to FIG. 3, the housing 6 is the same as in FIG. 1, but only the housing part 8 is shown with the interior of the chamber 4 and the plates 56. The same reference numbers are used in the following for parts with the same effect as for the first embodiment. In addition, the second embodiment is structured similarly to the first embodiment. The main differences are therefore described below.

The arrangement of the plates 56 shown in FIG. 3 corresponds to a momentary embodiment of the die-ejector, the plate 56 shown being in the operating position 60. The supporting surface 52 is only shown dashed in FIG. 3.

The operating position 60 of the plates 56 is assigned to the multi-part magnet 20, which is arranged in the installation recesses 18 or 18'. In contrast to the die-ejector shown in FIG. 1, the base 12 of the die-ejector shown in FIG. 3 is free of the further magnet, so no further magnet is assigned to the initial position 58. Thus, the magnetic field of the magnet 20 exerts a force of attraction F' on the plates 56, which is directed essentially parallel to the direction of movement B. The magnetic field of the magnet 20 is thus the same as that of the plates 56. There is a gap 118 between the magnet 20 and the plate 56, which is stopped in the operating position 60 by the stop element 78 and held in operating position 60 by the magnet 20.

The drive recesses 70 are penetrated by a drive element 100 and each have a drive area 102. The drive element 100 is designed as a shaft 100, which interacts with the drive area 102 of the plates 56 to be moved at a contact point 103, and driven by a motor.

The drive area 102 is each formed by a shoulder 102 formed on the plate 56 and running perpendicular to the direction of movement B of the plate 56. The design of the shaft 100 is explained in more detail in connection with FIG. 4. The shaft 100 comprises a circular cylindrical shaft part 110, which is arranged between a first and a second shaft hub 112 and 114, respectively. When assembled, the first shaft hub 112 rotates slidingly in the end wall and the second shaft hub 114 rotates slidingly in the rear wall.

The outer periphery of the shaft part 110, in planes perpendicular to the axis of rotation H, forms control cams 122, which are intended to interact with the drive area 102 of a plate 56 at the contact point 103. The control cams 122 are symmetrical in pairs with respect to a mirror plane running through a centrally arranged control cam, said control cams being perpendicular to the axis of rotation H of the shaft 100.

The section of the control cam 122 in which the control cam is in contact with the drive area 102 of the relevant plate 56 when the shaft 100 is turned is called the effective portion 124 of the control cam 122.

The effective portions 124 of the control cams 122 have a V-shaped arrangement as seen in the unwinding of the shaft, with the central effective portion forming the tip of the V-shape and the other effective portions 124 being offset forward with respect to the tip of the V-shape as seen in the direction of rotation S from the operating position to the initial position. The direction of rotation W indicates the direction of rotation from the initial rotary position to the operating rotary position.

Figure 4:
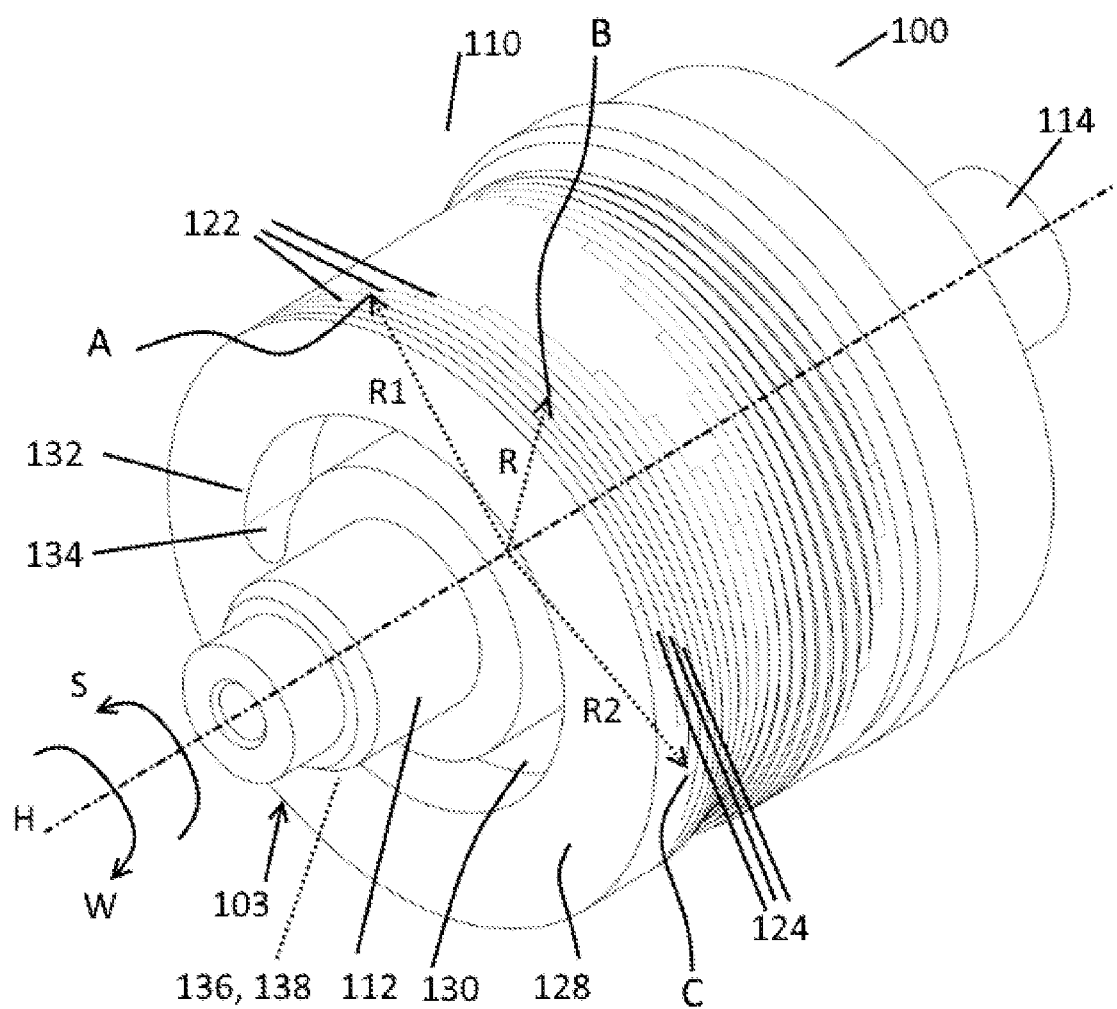
FIG. 4 shows a perspective view of the shaft built into the die-ejector as shown in FIG. 3.

In the effective portion 124 of the control cam, which extends from point A to point C in FIG. 4, the radius R increases continuously from a first radius R1 corresponding to point A to a second radius R2 corresponding to a larger radius R2 corresponding to point C. The radius R1 and R2 are assigned to the operating position 60 and the initial position 58 of the respective plate 56, respectively. The effective section 124 forms an essentially spiral arc of the control cam 122.

One end face 128 of the shaft 100 has a circular arc-shaped groove 130 centric to the axis of rotation H to accommodate a pin 131 fixed relative to the chamber. One end 132 of the groove 130 forms a first rotary stop 134 of the shaft 100 assigned to the operating rotary position and the other end 136 forms a second rotary stop 138 of the shaft 100 assigned to the initial rotary position. To transfer the plates 56 from the operating position 60 to the initial position 58, the shaft 100 is turned in one direction of rotation S from an operating rotary position, in which the plates 56 are in the operating position 60, to an initial rotary position, in which the plates 56 are in the initial position 58. In FIG. 3, the shaft 100 is shown in the operating rotary position.

The control cams 122 are designed in such a way that the radius of the respective control cams increases when turning the shaft 100 from the operating rotary position to the initial rotary position. The radius increases continuously between the operating position and the initial position to allow continuous movement of the plates 56 when turning the shaft 100.

When turning the shaft 100 from the operating rotary position to the initial rotary position, the control cam 122 comes into contact with the drive area 102 of the plate 56 in question.

As the shaft 100 continues to rotate, the control cam therefore pushes the plate 56 assigned to it further and further in the direction of initial position 58, with the magnet 20 simultaneously exerting an attractive force F' in the direction of operating position 60. As a result, the plates 56 are lowered from the operating position 60 and the plates 56 remain in contact with the corresponding control cam 122.

To move the plates 56 from the initial position 58 to the operating position 60, the shaft 100 is rotated in the opposite direction to the direction of rotation S. The shaft 100 is driven by a motor back and forth between the initial rotary position and the operating rotary position.

The invention claimed is:

1. Die ejector (2) configured to support dies provided on a carrier for removal of the dies from the carrier, the die ejector comprising:
   a chamber (4) subjected to a vacuum, said chamber having a cover plate (40) which has a passageway, wherein a surface of said cover plate is facing away from the chamber (4) and forms a supporting surface (52) for the carrier provided with the dies, a plurality of plates (56) which are arranged in the interior of the chamber (4), which are movable back and forth between an initial position (58) and an operating position (60), respectively; said plates having a drive recess (70), wherein a plate plane of said plates is aligned transversely to the cover plate (40) and an edge portion of said plates extends perpendicular to a direction of movement of the plates and faces towards the cover plate to form an impact edge (77) which interacts with the support in order to support the removal of the dies from the carrier; the initial position (58) being set back towards the interior of the chamber (4) with respect to the operating position (60);
   and a drive element (100) driven by a motor and which penetrates the drive recesses (70) of the plates, the drive recesses (70) each having a drive area (102) which is designed such that the drive element (100) interacts with the drive area (102) in order to move the plates (56) from the operating position (60) to the initial position (58),
   wherein
   the die ejector includes a magnet (20) interacting with anchor sections (74) of the plates (56) exerts on the plates (56) an attraction force (F') directed in a direction of the operating position (60), and a stop element (78) stops the movement of the plates (56) in the operating position (60), the plates (56) abutting against the stop element (78) in the operating position (60).

2. Die-ejector (2) according to claim 1, characterized in that the stop element (78) also stops the movement of the plates (56) in their initial position (58).

3. Die-ejector (2) according to claim 1, characterized in that the stop element (78) is designed as a flattened bolt and penetrates a stop recess (70) of the plates (56).

4. Die-ejector (2) according to claim 1, characterized in that there is always an air gap between the magnet (20) and the plates (56).

5. Die-ejector (2) according to claim 1, characterized in that the plates (56) are T-shaped and a crossbeam of the T-shaped plate forms the anchor section (74), a side of the crossbeam facing the magnet (20) runs parallel to the surface of the magnet (20).

6. Die-ejector (2) according to claim 1, characterized in that the drive recesses (70) each have a further drive area (104) designed such that the drive element (100) interacts with the further drive area (104) of the drive recesses in order to move the plates (56) from the initial position (58) in a direction of the operating position (60), and a further magnet (10) is arranged near the initial position (58) such that the anchor section (74) is located between the magnet (20) and the further magnet (10), wherein the drive element (100) moves the anchor section (74) of the plates (56) from the initial position (58) in the direction of the operating position (60) away from the further magnet (10) in a direction of the magnet (20) at least until the attraction force (F') of the magnet (20) is greater than an attraction force (F) of the further magnet (10), and the plates (56) then move into the operating position (60) under the attraction force (F') of the magnet (20), and vice versa for the movement of the plates (56) from the operating position (60) in a direction of the initial position (58) away from the magnet (20) towards the further magnet (10).

7. Die-ejector (2) according to claim 6, characterized in that the driving element (100) comprises a camshaft (100) which is rotatably driven about its axis by means of the motor, wherein cams (106) of said camshaft interact with the drive areas (102) and the further drive areas (104) of the plates (56).

8. Die-ejector (2) according to claim 7, characterized in that the cams (106) are arranged, in a circumferential direction of the camshaft (100) in such a way that the plates (56) are moved in a predetermined order between the initial position (58) and the operating position (60) and vice versa.

9. Die-ejector (2) according to claim 7, characterized in that the cams (106) have an involute shape.

10. Die-ejector (2) according to claim 7, characterized in that the drive areas (102) and the further drive areas (104) are each formed by a shoulder (102, 104) formed on the plates (56) which extends transversely to the direction of movement of the plates (56), and respective cams (106) assigned to respective plates (56) abut a respective shoulder when the camshaft (100) is rotated.

11. Die-ejector (2) according to claim 1, characterized in that the drive element (100) comprises a shaft (100) which is driven rotatably about its axis by means of the motor, wherein the outer circumference of said shaft forms control cams (122) which lie in planes extending perpendicular to the axis, and the shaft (100) is turned for transferring the plates (56) from the operating position (60) into the initial position (58) from an operating rotary position in which the plates (56) are in the operating position to an initial rotary position in which the plates (56) are in the initial position, wherein the control cams (122) each interact with the drive area (102) of an associated plate or plates in order to push or to pull the plate or plates against the attraction force (F') of the magnet (20) in a direction of the initial position (58) as a result of an increase in a radius of the control cam (122).

12. Die-ejector (2) according to claim 11, characterized in that in the operating rotary position, there is a gap between the drive area (102) of the plate and the control cam (122).

13. Die-ejector (2) according to claim 11, characterized in that the shaft (100) is driven back and forth between the initial rotary position and the operating rotary position.

14. Die-ejector (2) according to claim 13, characterized in that an end face (128) of the shaft has a recess (130) which is central to the axis, circular-arc-shaped, and groove-shaped for receiving a pin (131) which is arranged in a fixed position relative to the chamber,
one end of the recess (130) forms a first rotational stop (134) of the shaft assigned to the operating rotary position, and the other end forms a second rotational stop (138) of the shaft assigned to the initial rotary position.

15. Die-ejector (2) according to claim 11, characterized in that the control cams (122) are arranged such that the plates (56) are moved in a predetermined order between the initial position (58) and the operating position (60) and vice versa.

16. Die-ejector (2) according to claim 1, characterized in that the plates (56) are designed in several parts with a base plate (68) having the anchor section (74) and the drive recess (70) and a support plate (72) placed on the base plate (68) and forms the impact edge (77), and the stop element (78) interacts with the support plate (72).

\* \* \* \* \*